United States Patent
Bauer et al.

(10) Patent No.: US 7,407,891 B2
(45) Date of Patent: Aug. 5, 2008

(54) METHOD AND APPARATUS FOR LEVELING A SEMICONDUCTOR WAFER, AND SEMICONDUCTOR WAFER WITH IMPROVED FLATNESS

(75) Inventors: Theresia Bauer, Burgkirchen (DE); Robert Hoelzl, Postmuenster (DE); Andreas Huber, Garching (DE); Reinhold Wahlich, Tittmoning (DE)

(73) Assignee: Siltronic AG, Munich (DE)

( * ) Notice: Subject to any disclaimer, the term of this patent is extended or adjusted under 35 U.S.C. 154(b) by 0 days.

(21) Appl. No.: 11/268,356

(22) Filed: Nov. 7, 2005

(65) Prior Publication Data

US 2006/0097355 A1  May 11, 2006

(30) Foreign Application Priority Data

Nov. 11, 2004  (DE) .................. 10 2004 054 566

(51) Int. Cl.
*H01L 21/302* (2006.01)
(52) U.S. Cl. ...................... 438/714; 438/706
(58) Field of Classification Search .......... 438/706, 438/710, 712, 714, 719, 720, 723, 724
See application file for complete search history.

(56) References Cited

U.S. PATENT DOCUMENTS

| 4,401,367 | A | * | 8/1983 | Grantham et al. ........... 359/572 |
| 5,254,830 | A | | 10/1993 | Zarowin et al. |
| 5,318,676 | A | | 6/1994 | Sailor et al. |
| 5,338,416 | A | * | 8/1994 | Mlcak et al. ................. 205/643 |
| 6,074,947 | A | * | 6/2000 | Mumola ...................... 438/689 |
| 6,306,730 | B2 | | 10/2001 | Mitani et al. |
| 6,458,688 | B1 | | 10/2002 | Wenski et al. |
| 6,514,424 | B2 | | 2/2003 | Wenski et al. |
| 6,521,118 | B1 | * | 2/2003 | Starosvetsky et al. ....... 205/655 |
| 2001/0029086 | A1 | * | 10/2001 | Ogawa et al. ............... 438/448 |
| 2003/0041798 | A1 | | 3/2003 | Wenski et al. |

(Continued)

FOREIGN PATENT DOCUMENTS

DE  198 23 904 A1  12/1999

(Continued)

OTHER PUBLICATIONS

A New Method for the Precise Measurement of Wafer Roll off of Silicon Polished Wafer, Jpn. J. Appl. Phys. vol. 38, (1999), p. 38-39.

(Continued)

*Primary Examiner*—Kin-Chan Chen
(74) *Attorney, Agent, or Firm*—Brooks Kushman P.C.

(57) ABSTRACT

Semiconductor wafers are leveled by position-dependent measurement of a wafer-characterizing parameter to determine the position-dependent value of this parameter over an entire surface of the semiconductor wafer, etching the entire surface of the semiconductor wafer simultaneously under the action of an etching medium with simultaneous illumination of the entire surface, the material-removal etching rate dependent on the light intensity at the surface of the semiconductor wafer, the light intensity being established in a position-dependent manner such that the differences in the position-dependent values of the parameter measured in step a) are reduced by the position-dependent material-removal rate. Semiconductor wafers with improved flatness and nanotopography, and SOI wafers with improved layer thickness homogeneity are produced by this process.

20 Claims, 2 Drawing Sheets

U.S. PATENT DOCUMENTS

2004/0063329 A1 4/2004 Yanagisawa et al.
2005/0009374 A1* 1/2005 Gao et al. .................. 438/796

FOREIGN PATENT DOCUMENTS

| EP | 0 488 642 A2 | 6/1992 |
| EP | 0 511 777 A1 | 11/1992 |
| EP | 0511 777 A1 * | 11/1992 |
| EP | 0 798 766 A1 | 10/1997 |
| EP | 0 961 314 A1 | 12/1999 |
| EP | 1 100 117 A2 | 5/2001 |
| WO | WO 2004/027840 A2 | 4/2004 |

OTHER PUBLICATIONS

English Derwent Abstract AN 2000-015536 corresponding to DE 198 23 904 A1 and EP 0 961 314 A1.

* cited by examiner

METHOD AND APPARATUS FOR LEVELING A SEMICONDUCTOR WAFER, AND SEMICONDUCTOR WAFER WITH IMPROVED FLATNESS

BACKGROUND OF THE INVENTION

1. Field of the Invention

The present invention relates to a method and an apparatus for leveling a semiconductor wafer by means of an etching treatment with locally different removal of material. The invention also relates to both a semiconductor wafer with improved flatness and nanotopography and to an SOI wafer with a homogenous layer thickness which are obtainable by the method.

2. Background Art

A semiconductor wafer, in particular a single-crystal silicon wafer for use in the semiconductor industry, has to have a high flatness, in particular in order to meet the requirements for the production of integrated circuits. A generally recognized rule of thumb states that the $SFQR_{max}$ value of a semiconductor wafer must be no greater than the line width of the components which are to be produced on the semiconductor wafer. To allow the integration of the maximum possible number of circuits, the required flatness must moreover extend as close as possible to the edge of the front surface, the front surface being defined as the surface on which the components are to be produced. This means that the measurement of flatness must be carried out with only a very small edge exclusion, and the specified flatness values need to be satisfied not only by what are described as the full sites, but also by the partial sites. Full sites are surface elements on which complete components can be produced, whereas partial sites are surface elements at the edge of the wafer, on which there is insufficient space for complete components.

In defining the flatness of semiconductor wafers, the SEMI standard M1-94 draws a distinction between global flatness and local flatness. The global flatness relates to the entire wafer surface minus an edge exclusion which is to be defined. It is described by the GBIR ("Global Back Surface-Referenced Ideal Plane/Range"), which is a range of the positive and negative deviation from a back surface-referenced ideal plane for the entire front surface of the semiconductor wafer, which corresponds to the term TTV ("Total Thickness Variation") which was previously customary. The local flatness relates to a limited area on the semiconductor wafer, which generally corresponds to the area of the component to be produced thereon. It is often expressed as the SFQR ("Site Front Surface Referenced Least Square/Range"), a range of the positive and negative deviation from a front surface, defined by error square minimization, for an area of defined dimensions. The variable $SFQR_{max}$ represents the highest SFQR value for all the component areas on a defined semiconductor wafer. In the case of SFQR, it is always necessary to state the area to which the value given relates, for example an area of $26 \times 8$ mm$^2$ in accordance with the ITRS Roadmap.

A further flatness parameter is what is known as the nanotopography. This is defined as the peak-to-valley deviation in a predetermined surface element, e.g. $2 \times 2$ mm$^2$. The nanotopography is measured using measuring units such as ADE CR 83 SQM, ADE PhaseShift Nanomapper, or KLA Tencor SNT.

The flatness in the edge region of a semiconductor wafer is crucially influenced by what is known as the "edge roll off". "A New Method for the Precise Measurement of Wafer Roll off of Silicon Polished Wafer", Jpn. J. Appl. Phys. Vol. 38 (1999), 38-39 describes how to measure the "wafer roll off", or edge roll off. Edge roll off can occur both on the front surface and on the back surface of the semiconductor wafer. It can have a crucial influence on the SFQR values of the area elements located at the edge of the wafer. An edge roll off is disruptive in particular in the case of semiconductor wafers which, for example to produce SOI wafers, are bonded to a further semiconductor wafer, since the edge roll off of the wafer surfaces which are to be bonded to one another has a considerable influence on the bonding quality at the edge of the wafer.

Currently, semiconductor wafers which are used as substrates for the production of microelectronic components are generally produced by the following conventional process sequence: sawing, lapping and/or grinding, wet-chemical etching, stock-removal polishing and mirror polishing. It has been found that this process sequence is unable to ensure the flatnesses required for the ever-decreasing line widths.

In EP 798 766 A1, a vapor-phase etching step using PACE (plasma assisted chemical etching) process followed by a heat treatment is inserted between stock-removal polishing and mirror polishing in the conventional process sequence, in order to improve the flatness of the semiconductor wafer. It is demonstrated on the basis of processing of silicon wafers with a diameter of 200 mm, that the process sequence described allows GBIR results of 0.2-0.3 µm. The document does not give any local flatness data. Furthermore, it does not state the size of the edge exclusion for the flatness measurement. EP 961 314 A1 describes a similar method. After sawing, grinding, PACE and mirror polishing, GBIR values of at best 0.14 µm and $SFQR_{max}$ values of at best 0.07 µm are achieved.

The PACE process, as proposed in EP 961 314 A1, leads to a deterioration in the roughness of a polished wafer, which can be partially reduced by a hydrophobizing step immediately before PACE. PACE has to be carried out in vacuo, which makes the process complex in terms of the equipment required. Moreover, the semiconductor wafer is contaminated with the decomposition products of the gases used for etching, requiring an additional cleaning step, as described in EP 1 100 117 A2. Also, this process is not carried out over the entire surface, but rather by scanning the semiconductor wafer. This is, on the one hand, very time-consuming, and on the other hand, leads to problems with regard to the nanotopography in the scanning overlap region and to problems with regard to flatness ($SFQR_{max}$ and edge roll off) in the outer region of the semiconductor wafer, up to a distance of approx. 5 mm from the edge of the wafer. One possible cause is the increased suction at the edge of the semiconductor wafer and therefore a reduction in the etching medium, since work is carried out in vacuo. The required overlap during scanning has an adverse effect in particular on the nanotopography at the overlap positions. The larger the diameter of the nozzle which is used to supply the etching medium, the worse the deterioration becomes. However, for economic reasons the nozzle diameter cannot be selected to be as small as may be desirable.

Consequently, the methods which are known in the prior art are unable to satisfy the geometry requirements for components with line widths of less than or equal to 65 nm, that is to say $SFQR_{max}$ values of at most 65 nm. In this context, the most serious problems occur in the edge region of the semiconductor wafer, since the edge exclusion of currently 3 mm (for line widths of 90 nm) is reduced to 2 mm or 1 mm for the future line widths of 65 nm or less, and the partial sights are also taken into account when assessing the flatness.

An additional problem arises in the case of what are known as SOI wafers. These semiconductor wafers have a semiconductor layer which is located on a surface of a base wafer or handle wafer. The thickness of the semiconductor layer varies as a function of the components to be processed. In general, a distinction is drawn between what are known as "thin layers" (thickness less than 100 nm) and what are known as "thick layers" (from 100 nm to approx. 80 μm). The base wafer may either consist entirely of an electrically insulating material (e.g. glass, quartz, sapphire) or may, for example, consist of a semiconductor material, preferably silicon, and merely be separated from the semiconductor layer by an electrically insulating layer. The electrically insulating layer may, for example, consist of silicon oxide.

SOI wafers are very important for the production of microelectronic components. The semiconductor layer of an SOI wafer has to have a very homogenous thickness all the way into the outermost edge region. In particular in the case of semiconductor layers with a thickness of 100 nm or less, the transistor properties, for example the threshold voltage, vary very considerably in the case of inhomogeneous layer thicknesses. The absolute thickness tolerance for SOI wafers with thin and thick semiconductor layers depends on the layer thickness. The measurement method used to measure the layer thickness is preferably spectroscopic ellipsometry, reflectometry or interferometry.

To allow the integration of a maximum number of circuits, moreover, the required layer thickness homogeneity has to extend as close as possible to the edge of the front surface. This in turn means a very small edge exclusion.

U.S. Pat. No. 6,306,730 relates to a standard process for producing SOI wafers, in which hydrogen ions are implanted to a predetermined depth into a silicon donor wafer or top wafer, the implanted donor wafer is bonded to a base wafer and then the bonded wafers are separated along the layer of implanted hydrogen. By controlling the implantation depth, a layer thickness homogeneity (standard deviation from the mean layer thickness) of 0.47 nm for a layer thickness of 130 nm is achieved after separation. Immediately after separation, however, the surface of the silicon layer has a high roughness. Consequently, a chemical mechanical polishing (CMP) step has to be carried out after separation, and after any further steps for thinning the silicon layer. This chemical mechanical polishing step on the one hand reduces the roughness, but on the other hand also has a significant adverse effect on the layer thickness homogeneity, in particular at the edge of the wafer. U.S. Pat. No. 6,306,730 B2 does not disclose either the layer thickness homogeneity for the polished end product or an edge exclusion for the intermediate product following separation.

Methods for the aftertreatment of an SOI wafer with a view to improving layer thickness homogeneity are also known. These are generally local etching methods involving scanning the SOI wafer, with greater amounts of material being removed by etching at locations where the layer thickness is higher. In accordance with US 2004/0063329 A1, the surface of the SOI wafer is scanned in a dry etching process by a nozzle which is used to locally supply a gaseous etching medium. EP 488 642 A2 and EP 511 777 A1 describe methods in which the semiconductor layer of the SOI wafer is exposed to an etching medium over its entire surface. However, this etching medium has to be locally activated by a laser beam or a light beam from a light source focused using an optical system scanning the surface (photochemical etching).

All methods in which the surface of the semiconductor layer has to be scanned in order to achieve a locally different removal of material by etching are very time-consuming and therefore expensive. Moreover, the scanning requires a complex motion on the part of the light source or the nozzle, on the one hand, or the SOI wafer, on the other hand.

Moreover, additional inhomogeneities in the layer thickness occur in particular in the edge region of the wafer, i.e. in a region up to 5 mm from the edge of the wafer, and in the regions in which the overlap occurs during scanning. Given a layer thickness of 520 nm, according to EP 488 642 A2, a layer thickness homogeneity of 10 nm is achieved, without any details being given as to the edge exclusion. According to EP 511 777 A1, with a layer thickness of 108 nm, a layer thickness homogeneity of 8 nm is achieved, although again no edge exclusion is indicated.

Therefore, despite the complex methods, the required layer thickness homogeneities are not achieved, in particular in the edge region of the SOI wafer.

SUMMARY OF THE INVENTION

An object of the invention is to provide a semiconductor wafer with improved flatness, in particular in the edge region, and improved nanotopography, which is suitable for the production of components with line widths of 65 nm or less. In this context, the term "semiconductor wafer" also encompasses an SOI wafer. A further object is to provide an SOI wafer with improved layer thickness homogeneity, in particular in the edge region.

These and other objects are achieved by a method for leveling a semiconductor wafer, comprising the following steps:

a) position-dependent measurement of a parameter which characterizes the semiconductor wafer in order to determine the position-dependent value of this parameter over an entire surface of the semiconductor wafer, b) etching treatment of this entire surface of the semiconductor wafer under the action of an etching medium and simultaneous illumination of this entire surface, the material-removal rate of the etching treatment being dependent on the light intensity at the surface of the semiconductor wafer, and the light intensity being preset in a position-dependent manner in such a way that the differences in the position-dependent values of the parameter measured in step a) are reduced by the position-dependent material-removal rate.

DETAILED DESCRIPTION OF THE PREFERRED EMBODIMENT(S)

Figure 1:
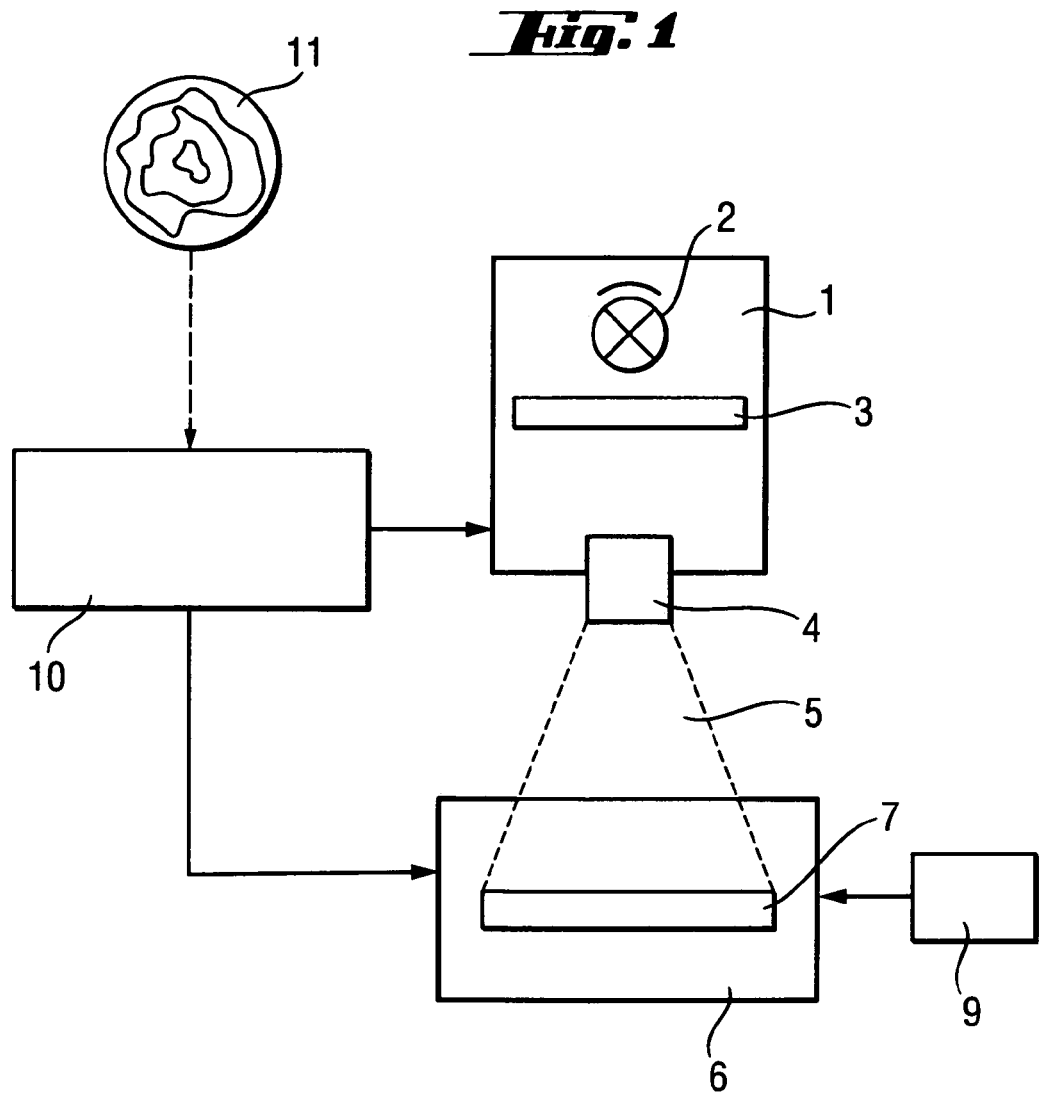
FIG. 1 diagrammatically depicts the structure of an apparatus according to the invention for leveling a semiconductor wafer.

The subject matter of the invention is thus a method for etching a semiconductor wafer. In this etching method, the surface of the semiconductor wafer, or in the case of an SOI wafer, the semiconductor layer, unlike in the prior art, is not treated in punctiform or scanning fashion, but rather is treated over its entire surface in one step. The locally different etching removal which is required for correction is achieved by a locally different material-removal rate, which in turn is implemented by a locally different light intensity. The local distribution of the light intensity is determined by the local values of the parameter previously measured. The parameter which is to be optimized in the method of the invention is measured in step a). The resulting measured values are used to control the local light intensity.

If, by way of example, the thickness homogeneity of the semiconductor layer of an SOI wafer is to be optimized, in step a) the position-dependent layer thickness is measured, and in step b) the local light intensity is controlled in such a way that a high material-removal rate is achieved at locations with a large layer thickness and a low material-removal rate is achieved at locations with a small layer thickness.

If the global flatness (GBIR) of a semiconductor wafer is to be optimized, in step a) the deviation of the wafer front surface from an ideal plane defined by the wafer back surface is determined, and in step b) the local light intensity is controlled in such a way that a high material-removal rate is achieved at local elevations and a low material-removal rate is achieved at positions of local recesses.

If, on the other hand, the local flatness (SFQR) of a semiconductor wafer is to be optimized, in step a) the deviation of the wafer front surface from an ideal plane referenced to a specific measurement window, for example of a size of 26×8 mm$^2$, is determined, and in step b) the local light intensity is controlled in such a way that a high material-removal rate is achieved at local elevations and a low material-removal rate is achieved at positions of local recesses.

The required etching removal for each point on the surface of the semiconductor wafer is determined on the basis of the measurement in step a). Both the required duration of the etching treatment and the required light intensity for each point on the surface of the semiconductor wafer can be calculated from the material-removal rate, dependent on the light intensity, which the etching medium used achieves for the corresponding semiconductor material.

The invention makes use of the fact that the material-removal rates of certain etching reactions are dependent on the charge carrier concentration in the semiconductor material, which in turn can be influenced by the intensity of the light which is radiated in. This is described more specifically below with respect to silicon. However, the invention can also be applied to other semiconductor materials.

The etching of silicon always comprises a two-stage reaction: in the first step, silicon is oxidized in an acidic etching medium to silicon oxide ($SiO_2$) or in an alkaline etching medium to $SiO_3^{2-}$. In the second step, if an acidic etching medium is used, the silicon oxide is removed by hydrogen fluoride (HF), or if an alkaline etching medium is used, the $SiO_3^{2-}$ is dissolved. If an etching medium of a suitable composition is selected, the etching reaction can be controlled in such a way that the oxidation step becomes the step which determines the reaction rate. If an acidic etching medium is used, this can be achieved, for example, by using an excess of hydrogen fluoride in relation to the oxidizing agent.

The present invention makes use of the fact that by irradiating with light, it is possible to influence the chemical potential and the concentration of the charge carriers in silicon or other semiconductor materials. The result is that the oxidation reaction rate becomes dependent on the light intensity, and therefore, the light intensity influences the etching rate. Light with a wavelength of less than 1100 nm is absorbed by silicon, with charge carrier pairs (electrons and holes) being formed. The absorption coefficient is highly dependent on the wavelength of the light. Light with a wavelength close to 1100 nm penetrates deep into the silicon; silicon is transparent to light with even longer wavelengths.

The spectral dependency of the absorption is important for the selection of a suitable light source for implementing the invention. By way of example, arc lamps are distinguished by a broad spectrum and high intensities, i.e. they can successfully be used for the illumination of entire semiconductor wafers. The appropriate wavelength region can be set by using suitable filters (high-pass, low-pass, etc.). In principle, however, it is possible to use all light sources which lead to the desired charge carrier concentration at the surface of the semiconductor wafer and to the desired depth profile of the charge carrier concentration. By way of example, mercury or sodium vapor lamps, lasers or LEDs are also suitable.

The etching medium may be gaseous or liquid or may contain a mixture of gaseous and liquid components. However, it is to be selected in such a way, in combination with the light wavelength region used and as a function of the semiconductor material, that the material-removal rate of the etching reaction is sufficiently dependent on the light intensity.

Since the treatment is carried out over the entire surface in one step without the need for scanning, it saves considerably amounts of time and therefore cost. Since the adjustment and positional resolution of the position-dependent light intensity can be selected with a high degree of precision, it is possible to avoid the overlap effects which occur during scanning in accordance with the prior art.

The method has the advantage that it has a local correcting action up to the edge of the semiconductor wafer, so that the required quality is achieved up to the wafer edge. In particular, it is possible to achieve the required flatness or layer thickness with an edge exclusion of 2 mm or less, including the partial sites. Since a vacuum is not required, it is possible to avoid changes in concentration of the etching medium at the edge of the semiconductor wafer, which are caused by the suction used in the prior art. If turbulence occurs at certain positions on the semiconductor wafer, for example in the vicinity of the edge, this turbulence can be compensated for in the calculation of the position-dependent light intensity.

The method is suitable both for removing inhomogeneities in the semiconductor layer of an SOI wafer and for removing inhomogeneities in a semiconductor wafer, including edge roll off. Therefore, the semiconductor wafers which have been treated with the aid of the method according to the invention are also eminently suitable for bonding to a further semiconductor wafer, since the bonding quality, in particular at the edge, is influenced by the SFQR values and by the edge roll off. The major economic benefits lie in the higher availability of the wafer surface for the production of components. This is particularly pronounced in the case of SOI wafers, on account of the significantly higher production costs.

In the case of an SOI wafer, for example, the method of the invention is generally carried out only on the front surface, i.e. the surface which bears the semiconductor layer, and in the case of a semiconductor wafer without a layered structure, the method is preferably carried out on the front surface. If the edge roll off on the back surface is also to be reduced, the method also has to be applied to the back surface. In this case, the method can be applied to the front surface and back surface sequentially or to both surfaces simultaneously.

It is preferable for no polishing to be carried out after the method according to the invention, in order not to degrade the flatness achieved.

In the case of an SOI wafer which has been produced by transferring a semiconductor layer from a donor wafer to a base wafer, the method is carried out after the wafers have been joined and the layer has been separated from the remainder of the donor wafer. In the case of an SOI wafer, the method according to the invention can be combined with one or more thermal processes for smoothing the surface or for boosting the bonding force and/or with one or more oxidation treatments for thinning the semiconductor layer.

One suitable apparatus for leveling a semiconductor wafer 7 is diagrammatically depicted in FIG. 1, and comprises:

a measuring apparatus 11 for the position-dependent measurement of a parameter which characterizes the semiconductor wafer 7, an etching chamber 6 for receiving the semiconductor wafer 7, comprising a holding apparatus for holding the semiconductor wafer 7 and a system for supplying and discharging the etching medium, a controllable illuminating apparatus 1, which is arranged in such a way that it can illuminate one side of the semiconductor wafer 7 located in the etching chamber 6 with a position-dependent light intensity, and a control unit 10 for converting the values of the parameter determined by the measuring apparatus 11 into instructions for controlling the illumination apparatus 1 and for passing on the instructions to the illumination apparatus 1.

Such an apparatus is particularly suitable for carrying out the method according to the invention, but is one example of a suitable apparatus.

The controllable illumination apparatus 1 comprises a light source 2 with a defined power and wavelength, optics 4, allowing illumination of the entire surface of the semiconductor wafer 7, and an apparatus 3 for setting the local light intensity. The etching chamber 6 comprises a holding apparatus (not shown), which receives the semiconductor wafer, adjusts the position of the semiconductor wafer and covers that part of the semiconductor wafer which is not to be etched, e.g. the back surface.

The method according to the invention allows the production of semiconductor wafers with an extremely flat surface and of SOI wafers with an excellent layer thickness homogeneity.

Therefore, the invention also relates to a semiconductor wafer, the front surface of which has a GBIR of at most 0.09 µm, an $SFQR_{max}$ in a measurement window with a size of 26×8 mm² including partial sites of at most 0.05 µm with an edge exclusion of 2 mm, and an edge roll off on the front surface of at most 0.2 µm, measured in a region between 1 mm and 3 mm from the edge of the semiconductor wafer.

It is preferable for the semiconductor wafer according to the invention to be further distinguished by an $SFQR_{max}$ in a measurement window of a size of 26×8 mm², including partial sites, of at most 0.03 µm with an edge exclusion of 2 mm.

The invention also relates to a semiconductor wafer, the front surface of which has a nanotopography (peak to valley) in a measurement window of a size of 2×2 mm² of at most 16 nm with an edge exclusion of 2 mm.

Very flat semiconductor wafers according to the invention, in particular consisting of single-crystal silicon, are suitable for use in the semiconductor industry, in particular for the fabrication of electronic components with line widths of 65 nm or less. They are also particularly suitable for use as donor wafers or base wafers for the production of bonded SOI wafers, in particular since the flatness including edge roll off is ensured even with a very small edge exclusion of just 2 mm.

The invention also relates to an SOI wafer comprising a semiconductor layer and a base wafer, the semiconductor layer being less than 100 nm thick and the relative standard deviation from the mean thickness of the semiconductor layer being at most 3% with an edge exclusion of 2 mm. The relative standard deviation in the thickness of the semiconductor layer is also referred to below as the layer thickness homogeneity.

The SOI wafer according to the invention, given a layer thickness of at most 100 nm, is preferably further distinguished by a layer thickness homogeneity of at most 1% with an edge exclusion of 2 mm.

It is most preferable that the method of the invention first be applied to the donor wafer and the base wafer before these wafers are bonded to one another, then for the base wafer with the semiconductor layer to be separated from the remainder of the donor wafer, and thereafter for the SOI wafer which has been produced in this way to be subjected to the method according to the invention once again, in order to homogenize the thickness of the semiconductor layer. An SOI wafer produced in this manner, in addition to the properties described above, is also distinguished by a GBIR of at most 0.1 µm and an $SFQR_{max}$ in a measurement window of a size of 26×8 mm², including partial sites, of at most 53 nm with an edge exclusion of 2 mm, and an edge roll off on the front surface of at most 0.25 µm, measured in a region between 1 mm and 3 mm from the edge of the semiconductor wafer.

Since the method of the invention can also be applied to SOI wafers with a thick semiconductor layer, the invention also relates to a SOI wafer, comprising a semiconductor layer and a base wafer, the semiconductor layer having a thickness in the range from 0.1 µm to 80 µm, and the relative standard deviation from the mean thickness from the semiconductor layer amounting to at most 4% with an edge exclusion of 2 mm.

The SOI wafer with thick semiconductor layer according to the invention is preferably further distinguished by a layer thickness homogeneity of at most 2% with an edge exclusion of 2 mm.

If the SOI wafer, as described above for SOI wafers with a thin semiconductor layer, is produced by applying the inventive method to the donor wafer and the base wafer and then to the SOI wafer, which is preferable, the SOI wafer with thick semiconductor layer is additionally distinguished by a GBIR of at most 0.11 µm and an $SFQR_{max}$ in a measurement window of a size of 26×8 mm², including partial sites, of at most 55 nm with an edge exclusion of 2 mm and an edge roll off on the front surface of at most 0.3 µm, measured in a region between 1 mm and 3 mm from the edge of the SOI wafer.

Moreover, an SOI wafer with thick or thin semiconductor layer according to the invention preferably has a nanotopography (peak to valley) in a measurement window of a size of 2×2 mm² of at most 16 nm, preferably at most 8 nm and most preferably at most 2 nm, with an edge exclusion of 2 mm.

The following text explains preferred embodiments of the invention with reference to the figures:

The method according to the invention can be applied to all semiconductor wafers without a layer structure, the semiconductor wafer preferably containing one or more substances selected from the group consisting of silicon, germanium, silicon carbide, III/V compound semiconductors and II/VI compound semiconductors. If the flatness of the front surface of a semiconductor wafer of this type is to be improved, a suitable parameter which is measured in step a) of the method is the height deviation from a defined ideal plane, as described above. This height deviation can be determined using a conventional geometry-measuring unit.

The method according to the invention can also be applied to all SOI wafers, the semiconductor layer of the SOI wafer preferably containing one or more substances selected from the group consisting of silicon, germanium, silicon carbide, III/V compound semiconductors and II/VI compound semiconductors. If the layer thickness homogeneity of the semiconductor layer is to be improved, this layer thickness is measured in step a) of the method according to the invention.

The thickness of the semiconductor layer can be measured in position-dependent fashion, for example using an ellipsometer, interferometer or reflectometer.

In general, the number and position of measurement points depends on the desired resolution. The maximum number of measurement points possible depends on the size of the measurement sensor. By way of example, the size of the measurement sensor is 2×2 mm$^2$ in the case of the measuring units ADE 9500 (for semiconductor wafers with a diameter of 200 mm) and ADE AFS (for semiconductor wafers with a diameter of 300 mm).

Then, the required local light intensity is calculated from the measured values. A suitable method is described below on the basis of geometry data, i.e. for optimizing the GBIR or SFQR, but the method can also be applied in similar fashion to nanotopography data or the layer thickness of a semiconductor layer in the case of an SOI wafer.

The geometry-measuring unit uses a measurement sensor of a size A×A (typically 4×4 mm$^2$ or 2×2 mm$^2$) to measure a complete mapping of the thickness t of the semiconductor wafer with a diameter D. The thickness t is strictly speaking the height deviation from an ideal plane defined by the back surface of the semiconductor wafer. This data can be transmitted as unprocessed data from the geometry-measuring unit to a computer. If a Cartesian coordinate system is then laid through the center of the semiconductor wafer, a value of the thickness, t(x,y), exists at every point x,y. In this context, x and y are varied in the grid of the measurement window size, which means that t(x,y) is to be understood as the mean of the thickness over the square, defined by $x-A/2$ to $x+A/2$ and $y-A/2$ to $y+A/2$. The illumination apparatus has a resolution of B×B pixels, for example 1024×1024. The corresponding value from the original thickness matrix is assigned to each matrix element M(a,b) with the aid of a computer-internal matrix of a size of B×B:

$$M(a,b)=t(|-D/2+a\cdot D/B|, |-D/2+b\cdot D/B|) \quad (1)$$

In the above, | | symbolizes the absolute magnitude function. The absolute magnitude function can be applied since the resolution of the illumination apparatus is typically greater than that of the original thickness data. If the opposite is the case, only geometric averaging of the original data need be carried out.

Following this transformation, the data is smoothed. The averaging radius R exists as a control parameter. The pixel with the coordinates i,j is assigned the mean from all the pixels which lie in a circle with radius R around the pixel i,j. A point x,y lies precisely in the circle around i,j if the following condition is satisfied:

$$(i-x)\cdot(i-x)+(j-y)\cdot(j-y)\leq R\cdot R \quad (2)$$

The new value is calculated from the mean of all M(x,y) which satisfy the above condition:

$$M_{smooth}(i,j)=\text{mean}(M(x_1,y_1),M(x_2,y_2),M(x_3,y_3),\ldots M(x_n,y_n)) \quad (3)$$

Based on the original system of coordinates, R is typically between 0.1 cm and 2 cm and is used as tuning parameter.

However, in addition to this geometric smoothing, it is also possible to carry out all other standard smoothing methods which are commonly employed in EDP.

The maximum value $\text{Max}_M$ and minimum value $\text{Min}_M$ of the matrix $M_{smooth}$ allow the generation of the grayscale matrix for the illumination of the semiconductor wafer:

$$\text{Black component of the pixel } i,j=(M_{smooth}(i,j)-\text{Min}_M)\\ *(\text{Max}_M-\text{Min}_M)*100\% \quad (4)$$

$$\text{Transparent component of the pixel } i,j=100\%-\\ (M_{smooth}(i,j)-\text{Min}_M)*(\text{Max}_M-\text{Min}_M)*100\% \quad (5)$$

This algorithm represents particularly thin areas of the semiconductor wafer as transparent, so that these areas are illuminated with a high light intensity. By contrast, the thickest areas are represented as black and therefore cannot be illuminated or can only be illuminated with a low light intensity. The calculation is suitable for the situation in which the removal of material decreases with increasing light intensity. The reverse situation can be calculated in a similar way.

The matrix of the calculated grayscales is projected in sharply focused form onto the surface of the semiconductor wafer by the illumination apparatus with the aid of suitable optics and is therefore used in step b) to control the local light intensity.

The light source 2 used may, for example, be a halogen lamp which emits light in a wavelength range from 200 nm to 1000 nm, so that an irradiation intensity of from 1 to 100 mW/cm$^2$ impinges on that surface of the semiconductor wafer which is to be illuminated. The wavelength range can in this case be narrowed by one or more fixed filters and adapted to the semiconductor material which is to be processed.

The optics 4 are preferably designed in such a way that that surface of the semiconductor wafer 7 which is to be treated is illuminated as homogenously as possible over the entire surface, i.e. preferably with fluctuations of less than ±10%, if there is no filter 3 between the light source and the semiconductor wafer. Alternatively, illumination inhomogeneities caused by the light source or the optics can be taken into account in the algorithm used to calculate the grayscales and compensated for in this way.

In one embodiment of the invention, the measurement results from a semiconductor wafer are used to produce a filter 3 which is precisely matched to this semiconductor wafer (FIG. 2) and is then used for the illumination of this one semiconductor wafer. In regions in which a particularly large amount of material is to be removed by etching, the filter must have a particularly high or particularly low light transparency in the wavelength range used, depending on whether the combination of etching medium used and semiconductor material to be etched means that the material-removal rate in the etching reaction increases or decreases with an increasing light intensity. The grayscales of the filter can be calculated using the algorithm described above.

The filter itself can be produced in various ways, for example by producing a filter film using a printing process or by using an LCD filter with a large number of LCD elements that can be actuated individually. In principle, however, all types of filter which permit a transmission from 0 to 100% and allow a suitable local resolution are suitable. The filter 3 is arranged in a suitable way between light source 2 and semiconductor wafer 7 in the illumination device 1 for illuminating the semiconductor wafer 7 for which it was produced, in such a way that the filter 3 is accurately imaged on the semiconductor wafer 7.

As an alternative to a filter with a locally different transmission of light, it is also possible to use a correspondingly produced mirror with a locally differing reflectivity.

A filter or a mirror which can in each case be used for just one semiconductor wafer is very expensive to produce. For this reason, the following embodiment of the invention is particularly preferred: A grayscale map is calculated with the aid of the control unit 10, preferably a computer, from the position-dependent value of the parameter measured in step a). The algorithm described above can be used for this purpose. The illumination of the semiconductor wafer 7 in step b)

is carried out by a projection apparatus which projects an image of this grayscale map onto the surface of the semiconductor wafer 7. In this case, therefore, the illumination apparatus 1 is a projection apparatus which can project the image of the grayscale made directly onto the semiconductor wafer, without the use of a fixed filter or mirror. The projection apparatus preferably operates according to the principal of a data or video projector (known in Europe as a "beamer"). In this case, the light from the projection lamp 2 is either passed through a controllable transparent LCD unit 3 or diverted by means of a controllable mirror chip (a matrix of many hundreds of thousands of microscopically small mirrors on a chip with an area of a few $cm^2$). A projection apparatus of this type, as is currently commercially available, makes it possible, for example, to control the transmission of light in a range from 0 to 100% with a resolution of 1024×768 pixels. This results in a density of approx. 6.5 points/$mm^2$ on the surface of a semiconductor wafer with a diameter of 300 mm that is to be treated.

The control unit 10 can control further functions of the apparatus as well as the illumination device 1, for example the loading and unloading of semiconductor wafers by means of a robot or the parameters for the etching treatment, such as for example temperature, duration of the etching treatment and flow rate of the etching medium.

The etching treatment can be carried out using a liquid or gaseous etching medium. It is also possible to use a mixture of liquid and gaseous substances.

By way of example, aqueous etching mixtures can be used as liquid etching media for silicon. Acidic etching media which can be used include aqueous solutions which contain hydrofluoric acid (HF) and an oxidizing agent, for example nitric acid ($HNO_3$), ozone ($O_3$) or hydrogen peroxide ($H_2O_2$). To ensure uniform wetting when using an acidic etching medium, it is preferable to add substances which reduce the surface tension of the etching medium, for example surfactants or acetic acid. Alkaline etching media which can be used include aqueous solutions which contain one or more of potassium hydroxide (KOH), sodium hydroxide (NaOH), tetramethylammonium hydroxide ($N(CH_3)_4OH$, TMAH), ammonium hydroxide ($NH_4OH$) or ammonium fluoride ($NH_4F$). In addition, the alkaline etching solutions may contain further additives, such as hydrogen peroxide ($H_2O_2$). Preferred alkaline etching media are aqueous solutions which contain hydrogen peroxide and at least one of the substances ammonium hydroxide and tetramethyl ammonium hydroxide.

By way of example, the following amounts of material removal are achieved in 60 seconds using aqueous solutions for the etching treatment of a boron-doped silicon wafer of 100 orientation with a resistivity in the range from 1 to 50 Ωcm without additional illumination:

TMAH 2.5%, room temperature: 6-12 nm of material removed $TMAH/H_2O_2/H_2O_2$ 1:1:5, 85° C.: 2 nm of material removed $NH_4OH/H_2O_2/H_2O$, 1:1:5, 85° C.: 0.5 nm of material removed HF 1%, $O_3$ 20 ppm, room temperature: 1-2 nm Gaseous etching media preferably contain hydrogen fluoride (HF) and an oxidizing agent, for example a nitrogen oxide or ozone ($O_3$). The gaseous etching medium may be diluted with inert gases or water vapor. Gaseous etching media have the advantage that the semiconductor wafer does not have to be dried after the etching treatment and the etching reaction can be terminated very quickly.

By way of example, an ozone-containing gas stream can be passed at room temperature through an aqueous hydrofluoric acid solution with a concentration of 60%, and the gas stream which has been enriched with hydrogen fluoride can be used as etching medium. In this case, the material-removal rate can be controlled, for example, by the ozone concentration and the flow rate through the hydrofluoric acid solution. If, for example, ozone is produced from oxygen by illumination, the etching reaction can be terminated very quickly by switching off the light.

The etching medium is preferably selected according to the demands imposed on the finished semiconductor wafer: aqueous etching media generally lead to greater roughening of the surface, which can be reduced by suitable additives (for example phosphoric acid, $H_3PO_4$) or by a very low water content. Etching media with an isotropic action lead to less roughening than etching media with an anisotropic action. Gaseous etching media tend to lead to less roughening or even to smoothing of the surface, in particular if they contain hydrogen chloride (HCl) in addition to hydrogen fluoride (HF). However, it is also possible to opt for an etching medium with a higher degree of roughening and to carry out a high-temperature step to smooth the surface following the etching treatment.

With all the etching media, the temperature and concentration are preferably selected as a function of the semiconductor material and the required removal of material, in a such a way that suitable material-removal rates are achieved.

The etching chamber 6 which is used for the etching treatment can receive the semiconductor wafer 7 either lying horizontally or standing vertically. The illumination 5 can be effected directly onto the semiconductor wafer 7 or may pass through transparent windows. To achieve a homogeneous etching removal of material (apart from the locally different light intensity), the etching medium or the semiconductor wafer 7 can be moved. By way of example, it is possible to rotate the semiconductor wafer 7, but this has to be simultaneously complemented by the illumination apparatus 1, for example by simultaneous rotation of the filter 3. However, it is preferable for the semiconductor wafer 7 not to be moved. Furthermore, it is possible to use heating or cooling to homogenize the temperature. A system 9 for supplying the etching medium, which delivers the etching medium in the required quantity, metering and quality (if appropriate, filtered), is connected to the etching chamber 6. The etching treatment can in this case be controlled by the control unit 10. In-situ measurement of the removal of material is possible by the use of an integrated measuring system for measuring the parameter that is to be optimized, in which case the current measurement data can immediately be transmitted to the control unit 10 and processed.

In a further preferred embodiment of the invention, flow inhomogeneities which occur in the etching medium, and which lead to a fluctuating removal of material at the edge of the semiconductor wafer, are compensated for by a corresponding correction of the local light intensity.

In another preferred embodiment of the invention, in an additional step c) an etching treatment of the entire surface of the semiconductor wafer is carried out, without illumination or with simultaneous illumination of the entire surface, in which case the light intensity is constant over the entire surface of the semiconductor wafer, so that a constant, position-independent removal of material is achieved. This step thins the semiconductor wafer or the semiconductor layer of an SOI wafer down to a desired target thickness if necessary. In the case of this two-stage process, only the measured inhomogeneities of the parameter are taken into account when calculating the locally different light intensity. After the homogenization in step b), the semiconductor wafer or semiconductor layer is reduced to the desired thickness in step c).

The combination of homogenization and thinning may, however, also be carried out as a single-stage process. In this case, the total amount of material which is required to be removed to reach the desired final thickness is taken into account in the calculation of the locally different light intensity.

EXAMPLES

Example 1

An SOI wafer with a diameter of 200 mm, produced by transferring a silicon layer from a donor wafer to a base wafer, is treated. The thickness of the wafer is 730 μm, the thickness of the silicon oxide layer is 140 μm, and the target thickness of the silicon layer located on the silicon oxide layer is 50 nm.

Figure 2:
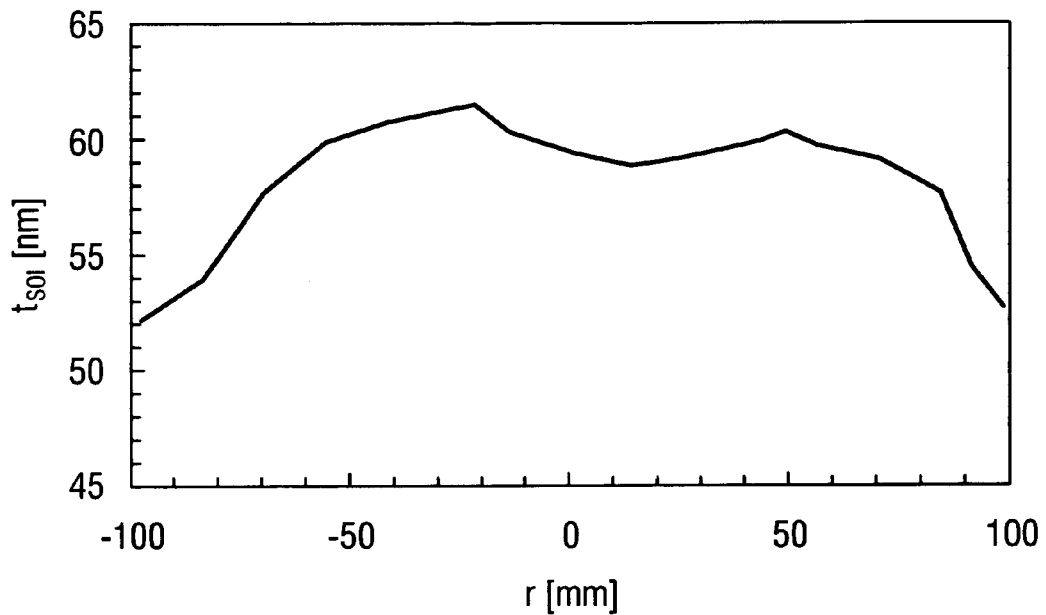
FIG. 2 shows a radial thickness profile for the silicon layer of an SOI wafer produced in accordance with the prior art.

In step a), the thickness of the silicon layer is measured accurately in a position-dependent manner by means of an interferometer. The measurement with 4000 measurement points and an edge exclusion of 1 mm gives a mean layer thickness of 58.3 nm with a standard deviation of 2.9 nm and a difference of 9.4 nm between maximum and minimum layer thickness. FIG. 2 illustrates a thickness profile along a diameter, i.e. the thickness $t_{SOI}$ of the semiconductor layer, measured in the unit nm, as a function of the radial position r, measured in the unit mm. The thickness measured values are stored in a computer and converted into a grayscale contrast filter. Positions with a greater layer thickness in this case give a lower light transparency in the filter, so that less illumination is produced at these positions., and therefore a higher material-removal rate is achieved, and vice versa.

Then, in step b), the SOI wafer is brought into contact with a liquid etching medium consisting of HF, $HNO_3$ and $H_2O$ in the etching chamber. In this case, the SOI wafer is fully illuminated, i.e. the material-removal rate is very low. After the entire surface of the silicon layer has been wetted with the etching medium, the SOI wafer is irradiated over the entire surface but, on account of the filter which has previously been produced, with a locally differing light intensity. The wavelength range used is 250-400 nm, the light intensity on the wafer varies locally between approx. 5 and 100 mW/cm², depending on the filtering. The etching treatment lasts 4 minutes at room temperature, and accordingly the etching rate is 2.1 nm/min. The SOI wafer is then immediately rinsed with deionized water in the etching chamber in order to quickly stop the etching process. After that, the SOI wafer is removed from the etching chamber and dried in accordance with the prior art.

Figure 3:
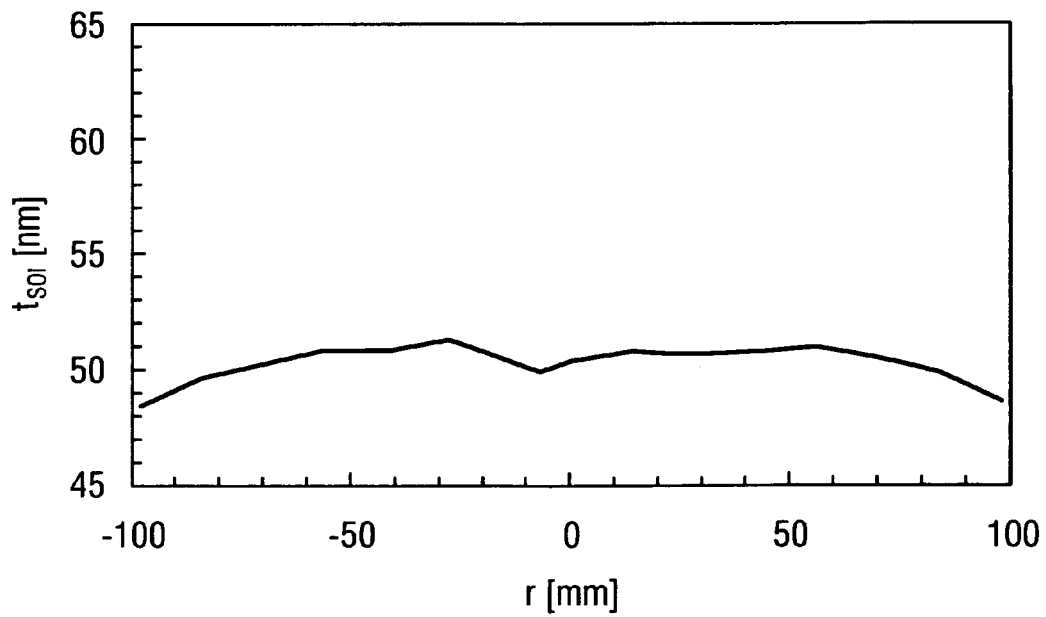
FIG. 3 shows the radial thickness profile for the silicon layer of the SOI wafer after it has been subjected to the method according to the invention.

Then, the position-dependent thickness of the silicon layer is measured again using the same thickness-measuring method as that used before the etching treatment. The mean layer thickness is now 50.2 nm with a standard deviation of 0.8 nm and a difference of 2.9 nm between the maximum and minimum layer thicknesses. The thickness profile along the diameter, FIG. 3, shows the clear leveling of the silicon layer.

Example 2

In step a), the local flatness of 6 silicon wafers with a diameter of 300 mm, which were produced from a Czochralski-pulled, boron-doped (1-10 Ωcm) single crystal, and had been subjected to stock-removal polishing, measured with an edge exclusion of 1 mm. The measuring unit ADE 9900 E+ is used, and the size of the surface elements is 26×8 mm2. Table 1 shows the measured $SFQR_{max}$ values including partial sites.

The unprocessed data (individual measured values) from the ADE measurement are stored in a computer and converted into a grayscale contrast filter, and a corresponding filter is produced for each silicon wafer. Then, the silicon wafers are introduced into the etching chamber individually, as described in Example 1, and subjected to an etching treatment on one side for leveling purposes using the associated filter. The etching medium used is an aqueous solution of 1% HF and 20 ppm $O_3$. The silicon wafers are treated for approximately 10 minutes at room temperature, with the local light intensity varying in a range from approximately 5 to 50 mW/cm².

After the etching treatment has ended, each silicon wafer is treated further in the same way as in Example 1 and the local flatness is measured again. Table 1 shows that the $SFQR_{max}$ values (in nm) have been considerably reduced by the etching treatment according to the invention.

TABLE 1

| | Wafer No. | | | | | |
|---|---|---|---|---|---|---|
| | 1 | 2 | 3 | 4 | 5 | 6 |
| $SFQR_{max}$ before | 101 | 103 | 96 | 105 | 101 | 104 |
| $SFQR_{max}$ after | 49 | 43 | 47 | 48 | 46 | 46 |

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for improving the geometry of a semiconductor wafer having a device surface and a back surface, prior to fabrication of electronic devices on the device surface, the wafer having at least one of thickness variation, edge roll-off, global flatness or local flatness as geometry imperfections, comprising:
   a) providing a plurality of semiconductor wafers;
   b) measuring at least one parameter which characterizes the geometry imperfection in a position dependent manner across a whole wafer surface and determining a position dependent value of the parameter;
   c) from the position dependent parameter value, creating for each individual wafer a grayscale of position dependent light intensity respectively related to the position dependent parameter values;
   d) simultaneously illuminating a whole wafer surface with said grayscale of light intensity while etching the surface so illuminated in an etching medium, the position dependent material removal rate increasing at position dependent higher light intensity such that a wafer having an improvement in geometry imperfection is obtained thereby.

2. The method of claim 1, wherein the position dependent parameter values are used to create a grayscale, position dependent filter, and the wafer is illuminated by a light source passing through the filter onto the wafer.

3. The method of claim 1, wherein a grayscale map is calculated with the aid of a computer from the position dependent parameter value and the grayscale light intensities are produced in a projection apparatus which projects an image of the grayscale map onto the wafer surface.

4. The method of a claim 3, wherein the grayscale map consists of a two dimensional array of pixels.

5. The method of claim 1, wherein the position dependent parameter values are smoothed.

6. The method of claim 1, further comprising illuminating the wafer with simultaneous illumination of invarying intensity such that a uniform position independent removal of material further occurs.

7. The method of claim 1, wherein a gaseous or liquid etching medium is employed.

8. The method of claim 1, wherein the etching medium consists of a gaseous medium.

9. The method of claim 1, wherein a position dependent parameter measured is a height deviation from an ideal plane.

10. The method of claim 1, wherein a surface etched in a position dependent manner is a device surface prior to fabrication of devices thereon.

11. The method of claim 10, wherein said wafer is an SOI water.

12. The method of claim 1, wherein said wafer is an SOI wafer.

13. The method of claim 12, wherein the SOI wafer has a semiconductor layer less than 100 nm thick on a base wafer, the relative standard deviation from the mean thickness of the semiconductor layer being at most 3% with an edge exclusion of 2 mm.

14. The method of claim 12, wherein the SOI wafer has a semiconductor layer less than 100 nm thick on a base wafer, the relative standard deviation from the mean thickness of the semiconductor layer being at most 1% with an edge exclusion of 2 mm.

15. The method of claim 1, wherein the thickness of the wafer is reduced in step d).

16. The method of claim 1, wherein the position dependent parameter measured is height variation from an ideal plane, and at least one of global flatness, local flatness, or edge roll-off is improved during step d).

17. The method of claim 16, wherein the local flatness of the wafer is improved.

18. The method of claim 1, wherein the etched wafer, following step d) has a GBIR of at most 0.09 µm, an $SFQR_{max}$ in a measurement window of 26 mm ×8 mm, including partial sites, of at most 0.05 µm with an edge exclusion of 2 mm, and an edge roll-off on the device surface of at most 0.2 µm measured in a region between 1 mm and 3 mm from the wafer edge.

19. The method of claim 18, wherein the $SFQR_{max}$ of the device surface is at most 0.03 µm.

20. The method of claim 18, wherein the device surface has a nanotopography such that peak to valley deviations on the device surface in a measurement window of 2 mm×2 mm are at most 16 nm.

* * * * *

UNITED STATES PATENT AND TRADEMARK OFFICE
CERTIFICATE OF CORRECTION

PATENT NO. : 7,407,891 B2  
APPLICATION NO. : 11/268356  
DATED : August 5, 2008  
INVENTOR(S) : Theresia Bauer et al.

Page 1 of 1

It is certified that error appears in the above-identified patent and that said Letters Patent is hereby corrected as shown below:

Column 15, Line 20, Claim 11:

Delete "water" and insert -- wafer --.

Signed and Sealed this

Eleventh Day of November, 2008

JON W. DUDAS  
*Director of the United States Patent and Trademark Office*